US009571137B2

(12) United States Patent
Robert et al.

(10) Patent No.: US 9,571,137 B2
(45) Date of Patent: Feb. 14, 2017

(54) SINGLE TONE RF SIGNAL GENERATOR

(71) Applicant: NXP B.V., Eindhoven (NL)

(72) Inventors: Sebastien Robert, Caen (FR); Olivier Jamin, Caen (FR); Sebastien Amiot, Caen (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/821,532

(22) Filed: Aug. 7, 2015

(65) Prior Publication Data

US 2016/0043754 A1    Feb. 11, 2016

(30) Foreign Application Priority Data

Aug. 8, 2014   (EP) .................................... 14290237

(51) Int. Cl.
*H04B 1/04*   (2006.01)
*H03F 1/32*   (2006.01)
(Continued)

(52) U.S. Cl.
CPC .......... *H04B 1/0475* (2013.01); *H03F 1/3247* (2013.01); *H03F 1/3282* (2013.01);
(Continued)

(58) Field of Classification Search
CPC .......... H03F 1/3247; H03F 3/24; H03F 3/245; H03F 1/3241; H03F 1/3258; H03F 2201/3233; H03F 2200/102; H03F 1/3294; H03F 2200/451; H03F 3/189; H03F 2200/336; H03F 3/19
(Continued)

(56) References Cited

U.S. PATENT DOCUMENTS 5,838,210 A * 11/1998 Midya ...................... H03C 1/06
                                                    332/107
8,489,042 B1 * 7/2013 Hietala ................ H04B 1/0475
                                                    455/114.3
(Continued)

FOREIGN PATENT DOCUMENTS

WO        96/25791        8/1996

OTHER PUBLICATIONS

Abid, M. et al.; "Mixed Cartesian Feedback for Zero-IF WCDMA Transmitter"; IEEE Second Latin American Symposium on Circuits and Systems, Feb. 23-25, 2011, Bogata; 4 pages (2011).
(Continued)

*Primary Examiner* — Ajibola Akinyemi

(57) ABSTRACT

A single tone RF signal generator and a method of generating a single tone RF signal. The single tone RF signal generator includes an output and a power amplifier that has an input. The power amplifier is operable to receive an RF signal including a first harmonic corresponding to a single tone signal to be produced by the signal generator. The power amplifier is also operable to amplify the RF signal. The power amplifier is further operable to provide the amplified RF signal to the output of the signal generator. The single tone RF signal generator further includes a feedback circuit connected between the output of the signal generator and the input of the power amplifier. The feedback circuit is configured to add one or more predistortion harmonics to the RF signal received by the power amplifier for cancelling harmonics in the amplified RF signal provided by the power amplifier.

15 Claims, 5 Drawing Sheets

(51) Int. Cl.
  *H04B 1/62* (2006.01)
  *H04L 27/36* (2006.01)
  *H05B 6/68* (2006.01)
  *H05B 6/70* (2006.01)

(52) U.S. Cl.
  CPC ............ *H04B 1/62* (2013.01); *H04L 27/368* (2013.01); *H05B 6/686* (2013.01); *H05B 6/705* (2013.01); *H03F 2200/207* (2013.01); *H04B 2001/0425* (2013.01); *H04B 2001/0433* (2013.01)

(58) Field of Classification Search
  USPC ...................................................... 455/114.3
  See application file for complete search history.

(56) References Cited

U.S. PATENT DOCUMENTS

2007/0298734 A1* 12/2007 Woo ...................... H03F 1/0211
                                                          455/114.3
2013/0082775 A1    4/2013 Matsumoto et al.

OTHER PUBLICATIONS

Extended European Search Report for application 14290237.8 (Feb. 18, 2015).

\* cited by examiner

SINGLE TONE RF SIGNAL GENERATOR

CROSS-REFERENCE TO RELATED APPLICATIONS

This application claims the priority under 35 U.S.C. §119 of European patent application no. 14290237.8, filed Aug. 8, 2014 the contents of which are incorporated by reference herein.

FIELD OF THE INVENTION

This invention relates to a single tone radio frequency (RF) signal generator, a method of generating a single tone RF signal, an RF heating apparatus and a microwave oven.

BACKGROUND OF THE INVENTION

FIG. 1A shows an example of a single tone frequency generator. The frequency generator includes an oscillator 2 for producing a signal having the frequency of the single tone, and an output 6. It is known that single tone frequency generators can suffer from the presence of harmonics at the output 6. These harmonics can affect the performance of the generator in terms of its ability to provide a clean signal having a single frequency.

As shown in FIG. 1A, one way of reducing the presence of harmonics is to use a low pass filter 4. The low pass filter 4 is positioned between the oscillator 2 and the output 6.

The effect of the low pass filter 4 is illustrated in FIG. 1B. As shown in FIG. 1B, the low pass filter 4 has an response 8 that allows the first harmonic H1 (which corresponds to the fundamental of the single tone output) to pass, while filtering out the second, third and higher harmonics.

Although the use of a low pass filter of the kind explained above can be effective in removing harmonics that can otherwise affect the performance of a single tone frequency generator, the filter may be expensive. Also, it may be difficult to use a low pass filter for high power applications (≥50 dBm, for example).

In the field of digital data transmissions, it is known to apply a technique that involves modifying a signal prior to amplification, for removing distortion that can otherwise create unwanted emission in adjacent channels. An example of this is explained below in relation to FIG. 2.

FIG. 2 shows a digital data transmission circuit 10. The circuit 10 includes a digital modulator 14 which receives data at an input 12 for transmission by an antenna 20. The circuit 10 also includes an up conversion mixer 16 and a down conversion mixer 24. The circuit 10 further includes a power amplifier 18 and an attenuator 22. The down conversion mixer 24 and the attenuator 22 are provided in a feedback circuit that is connected to the output of the power amplifier 18 by a coupler 19.

During operation, the up conversion mixer 16 provides up conversion in the desired channel for digital data transmission and this up converted signal is provided then to the power amplifier 18 and subsequently transmitted via the antenna 20. Part of the output signal is fed back via the coupler 19, through the attenuator 22 and is down converted by the down conversion mixer 24. This feedback signal is then provided to the digital modulator 14. Complex algorithms are then used in the digital modulator 14 to minimise the power in the unwanted channels. In essence, the digital modulator 14 modifies the data input 12 by applying pre-distortion to the signal in accordance with the feedback in order to minimise unwanted emissions in side channels of the transmitted signal. This is illustrated in the graph in the lower part of FIG. 2, which illustrates that the adjacent channel power ratio (ACPR) of the wanted digital channel 26 compared to the intermodulation signals in the unwanted side channels 28 can be enhanced using the circuit 10.

The circuit shown in FIG. 2 is used, as noted above, for digital data transmission and as such the predistortion introduced by the digital modulator 14 is relevant only in the case of a modulated signal. Additionally, the circuit 10 shown in FIG. 2 requires a large bandwidth in order to be able to detect the power in the adjacent channels 28. Accordingly, the circuit 10 shown in FIG. 2 is not useful in the case of single tone applications.

One example of a single tone application is a RF heating apparatus. This is shown schematically in FIG. 3. In FIG. 3, the RF heating apparatus includes an oscillator 2 which produces a signal which is amplified by a power amplifier 5. The amplified signal is then introduced into a cavity 30 of the RF heating apparatus using an antenna 20. The cavity 30 itself can act as a low pass filter and can thus provide at least some attenuation of the unwanted harmonics of a single tone signal. Nevertheless, there exists a need for the production of a single tone RF signal having a low level of harmonics.

As noted above, a low pass filter may be expensive and/or difficult to use for high power applications such as RF heating. Because of this, it may generally be necessary to place the low pass filter used in an RF heating apparatus in front the power amplifier. This is illustrated in FIG. 4.

The circuit of FIG. 4 includes an oscillator 2, a power amplifier 5 and a low pass filter 4 located in between the oscillator 2 and the power amplifier 5. Note that the circuit in FIG. 4 is similar that that described above in relation to FIG. 3, and may be used for RF heating applications. A problem with the arrangement shown in FIG. 4 however, is that the power amplifier 5 itself can introduce unwanted harmonics into the single tone signal. Because the low pass filter 4 is placed before the power amplifier, it cannot remove harmonies that are introduced by the power amplifier. Accordingly, the low pass filer 4 only has limited effect in reducing the level of harmonics at the output.

An article by M. Abid et al. entitled "Mixed Cartesian Feedback for Zero-IF WCDMA Transmitter", IEEE, 2011, describes an adaptive power amplifier (PA) linearization technique. A WCDMA zero-intermediate frequency (Zero-IF) transmitter is provided with a modified Cartesian feedback (CFB) loop. The transmitter architecture consists of an analogue stage including forward I/Q modulator and feedback I/Q demodulator, and a digital stage adjusting the phase rotation around the loop.

SUMMARY OF THE INVENTION

Aspects of the invention are set out in the accompanying independent and dependent claims. Combinations of features from the dependent claims may be combined with features of the independent claims as appropriate and not merely as explicitly set out in the claims.

According to an aspect of the invention, there is provided a single tone RF signal generator. The single tone RF signal generator includes an output. The single tone RF signal generator also includes a power amplifier having an input. The power amplifier is operable to receive at the input an RF signal including a first harmonic corresponding to a single tone RF signal to be produced by the RF signal generator. The power amplifier is also operable to amplify the RF signal. The power amplifier is further operable to provide the amplified RF signal to the output of the signal generator. The single tone RF signal generator further includes a feedback circuit connected between the output of the signal generator and the input of the power amplifier. The feedback circuit is configured to add one or more predistortion harmonics to the RF signal received by the power amplifier for cancelling harmonies in the amplified RF signal provided by the power amplifier.

According to another aspect of the invention, there is provided a method of generating a single tone RF signal. The method includes amplifying an RF signal including a first harmonic corresponding to the single tone RF signal, the method also includes providing the amplified RF signal to an output of a single tone RF signal generator. The method further includes cancelling harmonics in the amplified RF signal provided to the output by using feedback from the output to add one or more predistortion harmonics to the RF signal prior to said amplifying.

Embodiments of this invention may allow the level of harmonies associated with a single tone RF signal to be reduced. Typically, these harmonics may be associated with a power amplifier that is used to amplify the signal before output. Reduction of the level of the harmonics may be achieved by adding predistortion harmonics to an RF signal before it is amplified. The predistortion harmonics may act to cancel out the harmonics that would normally be introduced by the power amplifier during amplification. The predistortion harmonics may be based on feedback received from an output of the single tone RF signal generator.

As noted above, the concept of predistortion is known from the field of digital data transmission, in that field, predistortion is applied in a channel including a range of frequencies, in order to reduce unwanted emission in adjacent channels. In accordance with embodiments of this invention it has, for the first time, been realised that predistortion can be used in a single tone RF signal generator to reduce harmonics produced by a power amplifier of the generator. Embodiments of this invention can find particular application in fields where a single tone RF signal is needed, for example, in RF heating applications.

It is envisaged that further components such as dividers, phase shifters etc. may also be present between the feedback circuit and the input of the power amplifier. Accordingly, although the feedback circuit is connected between the output of the signal generator and the input of the power amplifier, it is not essential that the feedback loop is connected directly to input of the power amplifier or indeed to the output of the signal generator.

The first harmonic may have a frequency F. The predistortion harmonics may have frequencies n×F, where n is an integer greater than 1. Accordingly, unlike prior applications making use of predistortion (e.g. in the field of digital data transmissions), according to an embodiment of the invention, predistortion may be added in the form of harmonics that are single tones. Viewing the first harmonic as the fundamental frequency of the signal to be produced by the signal generator, the predistortion harmonics can have frequencies that are overtones of the fundamental frequency.

Various arrangements for generating the first harmonic and the predistortion harmonics are envisaged. For example, the single tone RF signal generator may include a plurality of separate oscillators for generating the first harmonic and predistortion harmonics. Where separate oscillators are provided in this way, each oscillator may operate at a different frequency. An another arrangement, a common oscillator may be used to create a frequency that can subsequently be divided using one or more dividers for generating the frequencies of the first harmonic and the predistortion harmonics. Typically, in this example, the oscillator may operate at the frequency of the highest predistortion harmonic—this frequency can then be reduced by the dividers for generating lower predistortion harmonics and/or the first harmonic. Thus, in one example, the common oscillator may be configured to generate a frequency N×F, where N is the value of a for the highest predistortion harmonic added to the RF signal.

The feedback circuit may, in some examples, include a down-conversion stage. The down-conversion stage can be used to reduce the frequency of the feedback signal so that it can be processed to assess the levels of the harmonics associated with the single tone RF signal at the output. One or more detectors can evaluate the down-converted feedback signal to detect the power of the single tone RF signal produced by the single tone RF signal generator and one or more harmonics of the single tone RF signal. In one embodiment, the feedback signal can be down-converted into a DC or lower frequency signal, e.g. a DC or lower frequency voltage indicative of the power. For instance, the down-conversion stage may include one or more pairs of mixers and oscillators for down-converting the single tone RF signal and the one or more harmonics into respective DC or lower frequency (i.e. having a frequency lower than the single tone RF signal and the one or more harmonics) signals indicative of their powers. The oscillators in such examples can be tuned to the frequency of the single tone RF signal and the anticipated frequencies of the respective harmonics.

The parameters of the predistortion harmonics may be determined according to the phase and/or amplitude of the single tone RF signal. The phase and/or amplitude of the single tone RF signal may in some examples be evaluated by the feedback circuit to allow the parameters of the predistortion harmonics to be determined. In one embodiment, the feedback circuit is operable to determine the phases and amplitudes of the one or more predistortion harmonics as a linear function of the phase and/or amplitude of the single tone RF signal. Here it is assumed that parameters of the predistortion harmonics such as their phases and amplitudes are not sensitive to the frequency of the single tone RF signal.

In some examples, the generator may be operable dynamically to adjust the phases and amplitudes of the one or more predistortion harmonics in response to a change in the phase and/or amplitude of the single tone RF signal. This adjustment may include a calibration routine (which may also be performed at start up). The calibration routine may include determining the phase(s) and amplitude(s) of one or more lower predistortion harmonics (e.g. the $2^{nd}$ harmonic) prior to determination of one or more higher predistortion harmonics (e.g. the third harmonic). This can allow contributions at the frequencies of the higher harmonics, produced by the presence of the lower predistortion harmonics, to be taken into account when determining the parameters of the higher predistortion harmonics.

In one example, the RF signal received by the power amplifier, including the first harmonic and the predistortion harmonics may be sinusoidal. Thus, the RF signal may be given by:

$$x'(t) = a \sin(\omega t + \phi) + b \sin(2\omega t + \phi_2) + c \sin(3\omega t + \phi_3)$$

where:
a, $\phi$ and $\omega$ are the amplitude, phase and angular frequency of the first harmonic;
b, c, $\phi_2$ and $\phi_3$ are the amplitudes and phases of the predistortion harmonics. If it assumed that b<<a and c<<a, the second and third harmonics of the output signal of the power amplifier may be approximated to:

$$H2 = \alpha_1 b\sin(2\omega t + \varphi_2) - \frac{1}{2}\alpha_2 a^2 \cos(2\omega t + 2\varphi) + \frac{3}{2}\alpha_3 a^2 b\sin(2\omega t + \varphi_2)$$

$$H3 = \alpha_1 c\sin(3\omega t + \varphi_3) + \frac{3}{4}\alpha_3\left[-\frac{a^3}{3}\sin(3\omega t + 3\varphi) + 2a^2 c\sin(3\omega t + \varphi_3)\right]$$

In one embodiment, the following parameter values can be chosen:

$$b \approx -\frac{a^2\alpha_2}{2\alpha_1 + 3a^2\alpha_3}$$

$$\varphi_2 \approx 2\varphi - \frac{\pi}{2}$$

$$c \approx \frac{1}{2}\frac{a^3\alpha_3}{2\alpha_1 + 3a^2\alpha_3}$$

$$\varphi_3 \approx 3\varphi$$

for cancelling out the second and third harmonics. These parameters can cancel out harmonics produced by the power amplifier during amplification of the RF signal.

In some examples, the feedback circuit may further be configured to add one or more predistortion harmonics for cancelling spur in the amplified RF signal provided by the power amplifier. A frequency of these predistortion harmonics may be non-integer multiples of the frequency of the single tone RF signal.

According to a further aspect of the invention, there is provided an RF heating apparatus comprising a single tone RF signal generator of the kind described above. The RF heating apparatus may for instance be a microwave oven. Applications in lighting, medical or industrial RF heating are also envisaged.

For the purposes of this application, RF frequencies are considered to be frequencies in the range 100 MHz≤f≤10 GHz. In some examples, frequencies falling within ISM bands may be used. These frequencies may find particular in given applications or fields. For instance the ISM band 433.05-434.790 MHz may be used for RF lighting applications and the ISM bands 902-928 MHz and 2.4-2.5 GHz may be used for RF heating applications.

Note that as used in this disclosure, the term "oscillator" is taken to include components that are operable to produce a periodic signal (e.g. oscillators such as crystal oscillators (VCXO, TCXO, XO . . . etc.) and also frequency synthesisers.

BRIEF DESCRIPTION OF THE DRAWINGS

Embodiments of the present invention will be described hereinafter, by way of example only, with reference to the accompanying drawings in which like reference signs relate to like elements and in which.

DETAILED DESCRIPTION

Embodiments of the present invention are described in the following with reference to the accompanying drawings.

Embodiments of this invention can provide a single tone RF signal generator and a corresponding method of generating a single tone RF signal. As explained above, single tone signal generators often suffer from the presence of harmonics at their outputs, which can adversely affect the integrity of the signals that they produce. The harmonics may typically be introduced by a power amplifier of the generator. The presence of the harmonics can give rise to unwanted intermodulation effects and can also be detrimental to the compliance of a system incorporating the generator (for example an RF heating apparatus) with regulations relating to allowed frequency bands (for example, the ISM bands).

In accordance with embodiments of this invention, predistortion harmonics are used to reduce the level (amplitude) of harmonics in the output of a single tone RF signal generator. Typically, these predistortion harmonies may be provided in the form of single tones that are themselves harmonics (e.g. overtones) of the fundamental frequency associated with the single tone of the generator.

Figure 1A:
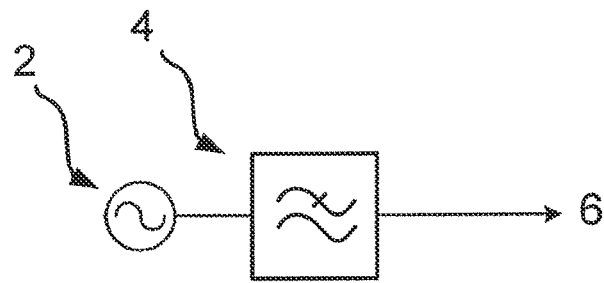
FIG. 1A shows a circuit for filtering an output of a single tone frequency generator.
Figure 1B:
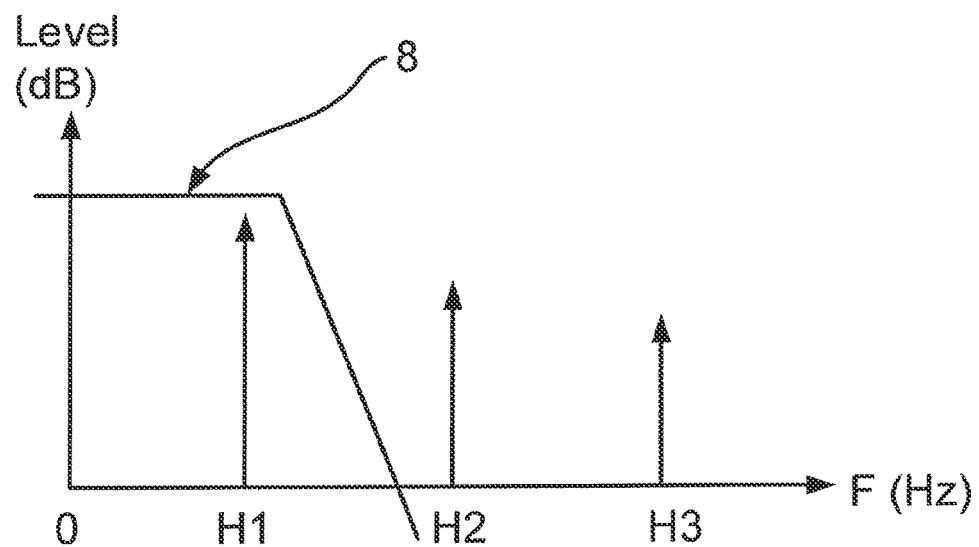
FIG. 1B illustrates the filtering of harmonics produced by the single tone frequency generator in FIG. 1A.
Figure 2:
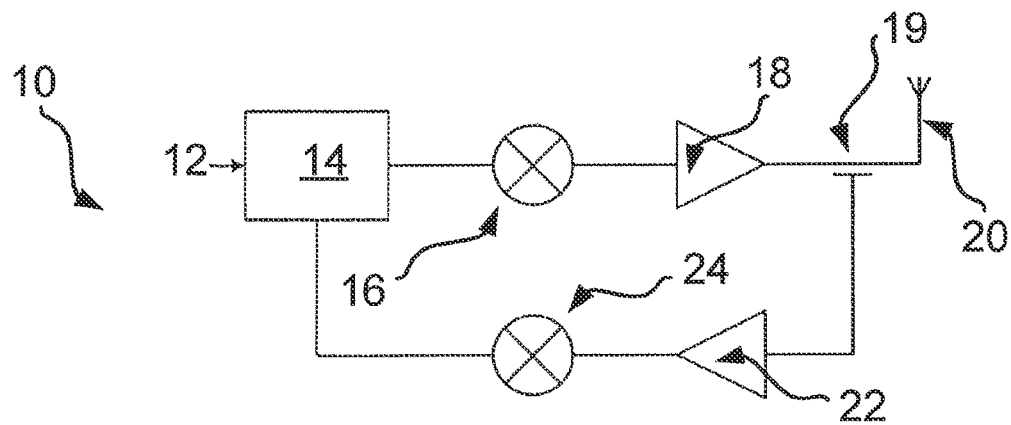
FIG. 2 illustrates an example of applying predistortion in a circuit for a digital data transmission, to optimise the adjacent channel power ratio (ACPR) of the circuit.
Figure 3:
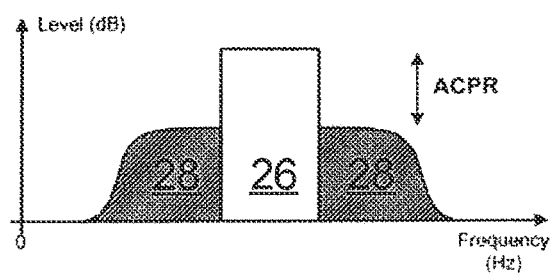
FIG. 3 schematically illustrates an RF heating apparatus in which RF energy is introduced into a cavity.
Figure 4:
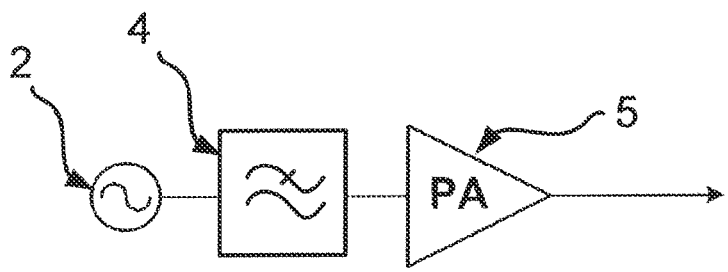
FIG. 4 shows an RF circuit having a low pass filter provided in front of a power amplifier.
Figure 5:
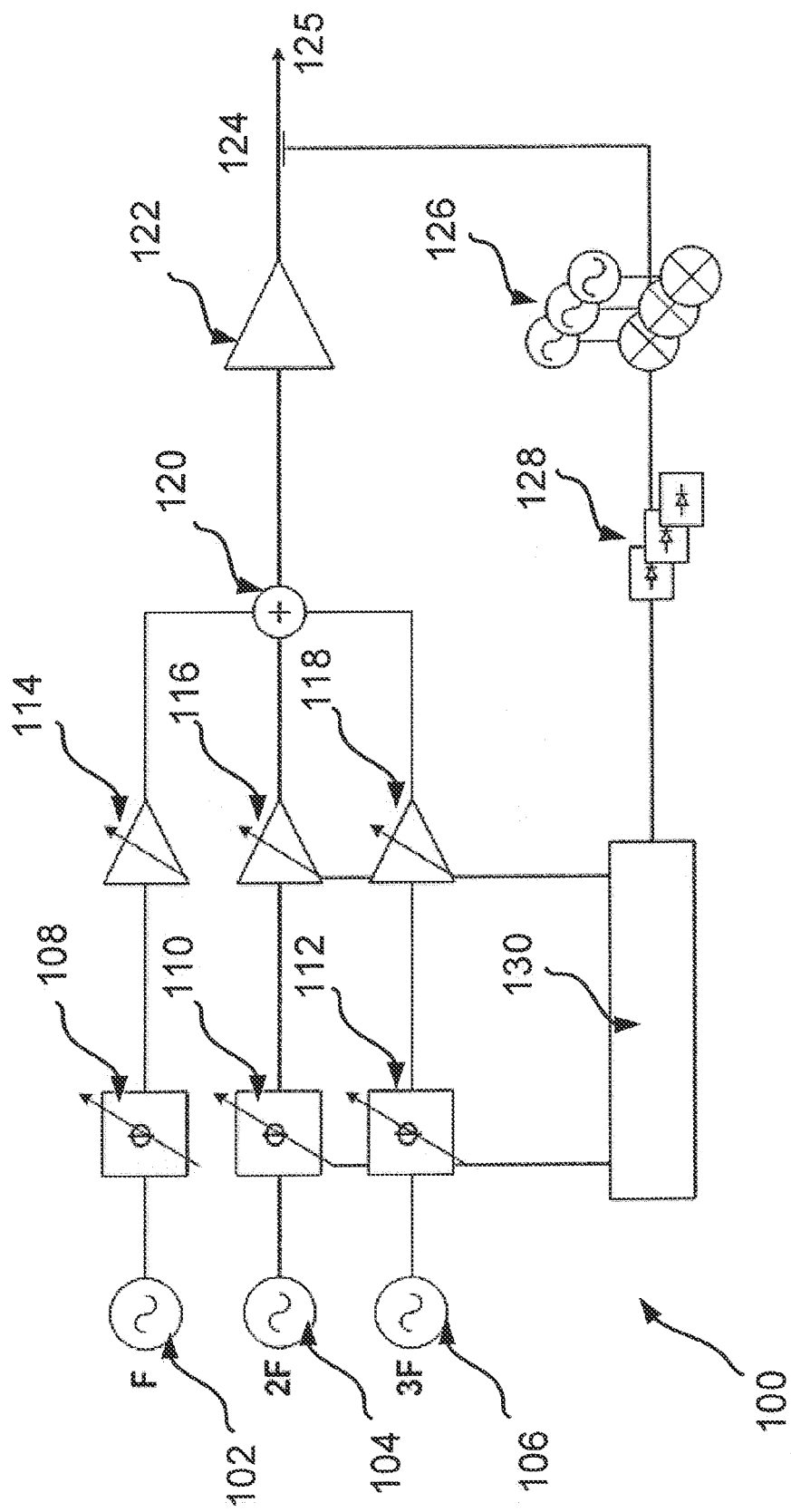
FIG. 5 shows a single tone RF signal generator in accordance with an embodiment of the invention.

A first embodiment of a single tone RF signal generator 100 is shown in FIG. 5.

The generator 100 includes a plurality of oscillators 102, 104, 106. The oscillator in this example generates a frequency F, which corresponds to the frequency of the single tone to be generated. As will be explained in more detail below, the oscillators 104 and 100 are provided to produce frequencies corresponding to predistortion harmonics that can be added to the signal produced by the oscillator 102 to produce an RF signal for amplification prior to output by the generator 100. The predistortion harmonics have the effect of cancelling out harmonics that would otherwise be produced during amplification.

The signal generator 100 also includes a plurality of phase shifters 108, 110, 112 and variable gain amplifiers 114, 116, 118. Under the control of circuitry 130, the phase shifters 108, 110, 112 and the variable gain amplifiers 114, 116, 118 can be used to adjust the amplitudes and phases of the signals produced by the oscillators 102, 104, 106 before they are added together by the adder 120 to produce an RF signal for amplification and output.

As shown in FIG. 5, the generator 100 includes a power amplifier 122. The power amplifier 122 has an input that receives the RF signal that includes the signals produced by each of the oscillators 102, 104, 106 as modified by the phase shifters 108, 110, 112 and/or variable gain amplifiers 114, 116, 118. As noted above, these signals are added together by the adder 120. The power amplifier 122 amplifies the RF signal and provides it to the output 125 of the generator 100. The arrangement of the oscillators 102, 104, 106, phase shifters 108, 110, 112, variable gain amplifiers 114, 116, 118 and the adder 120 described above can be used to provide an RF signal that has a first harmonic (associated with the frequency produced by the oscillator 102) and one or more predistortion harmonics (which are generated using the oscillators 104, 106 and their associated phase shifters 110, 112 and variable gain amplifiers 116, 118). These predistortion harmonics, when added to the RF signal to be provided to the power amplifier 122 can cancel out harmonics that would otherwise be produced at the output 125 of the generator 100. These harmonics are generally introduced into the output signal by the operation of the power amplifier 122, but may in some examples be introduced by other components of the system.

The phases and amplitudes of the predistortion harmonics can be based on a feedback signal. This will be described in more detail below.

As shown in FIG. 5, the generator 100 includes a feedback circuit that is coupled to the output 125 of the generator 100 by a coupler 124. In this example, the feedback circuit includes a down conversion stage 126 that includes a plurality of pairs of oscillators and mixers 126. A corresponding plurality of signal detectors 128 are also provided, which are connected to the outputs of the mixers. The oscillators of the down conversion stage can include an oscillator that is tuned to the frequency F of the single tone to be produced by the generator 100 and also a respective oscillator for one or more harmonics (e.g. second, third harmonic) of the single tone.

The number of mixer/oscillator pairs provided in the down conversion stage 126 can be chosen in accordance with the number of harmonics that are to be accounted for by the generator 100. In the embodiment of FIG. 5 it is shown that the second and third harmonics are used (their frequencies being 2F and 3F, and the corresponding predistortion harmonic frequencies being generated by the oscillators 104 and 106, respectively). It will be appreciated by those skilled in the art that higher harmonics (4F, 5F . . . etc.) will generally have a lower amplitude (e.g. they may be attenuated by the transfer function of the power amplifier) so that it may not be necessary to provide higher predistortion harmonics.

The outputs of the oscillators in the down conversion stage can be mixed with the feedback signal received via the coupler 124 to produce respective down converted feedback signals that can be evaluated by the detectors 128 to determine the amplitudes of the various components of the output signal. In particular, the amplitude of the single tone output can be evaluated, as can the amplitudes of the second and third harmonics (again, higher harmonics can be considered if necessary). In one example, the oscillators of the down conversion stage 126 are matched with the anticipated frequencies of the harmonics (2F, 3F) and of the single tone output (F) so that DC voltage signals are produced by the mixers for evaluation by the detectors 128. It is also envisaged that down conversion of the output signal may not necessarily require conversion to a DC signal and that in some examples a low frequency AC down converted feedback signal may be used instead.

The detectors 128 determine the amplitudes of the various harmonics at the output 125 as explained above and provide this information to the control electronics 130.

The control electronics 130 uses the amplitude information provided by the detectors 128 in order to evaluate the level of harmonics being produced at the output 125 of the generator 100. In response to this information, the control electronics 130 can use the phase shifters 110 and 112 and the variable gain amplifiers 116 and 118 to adjust the phases and amplitudes of predistortion harmonics that are added to the signal produced by the oscillator 102 prior to amplification by the power amplifier 122. The control electronics 130 can be configured to adjust the phases and amplitudes of the predistortion harmonics until the level of harmonics produced at the output 125 is minimised. Close control of the amplitudes of the harmonics in the output signal may therefore be achieved.

The control electronics 130 may be provided in the form of a microcontroller. The feedback circuit can, in such cases, include analogue to digital converters (ADCs) for converting the outputs of the detectors 128 before they are provided to the microcontroller.

It is also envisaged that the control electronics may be implemented by analogue circuitry.

It will be appreciated that in this embodiment the predistortion harmonies added to the RF signal are themselves single tones generated initially by the oscillators 104 and 106 and modified, where necessary, by the phase shifters 110, 112 and variable gain amplifiers 116, 118. This is in contrast to the use of predistortion techniques in fields such as digital transmission, in which predistortion is applied to a modulated signal across a range of frequencies to increase the ACPR.

Figure 6:
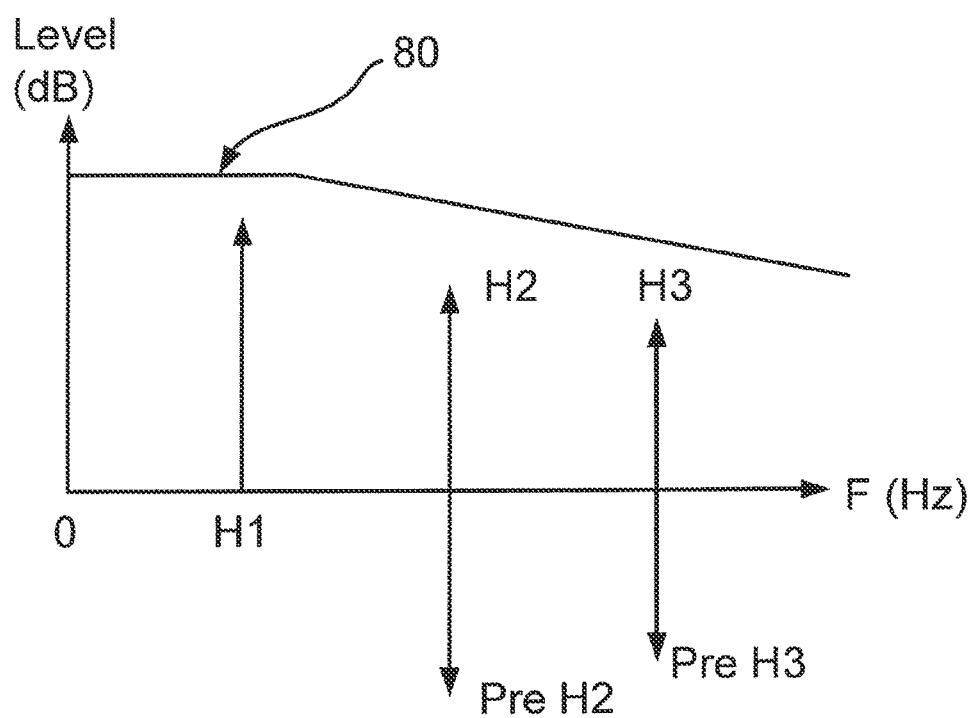
FIG. 6 illustrates the filtering of harmonics produced by the single tone RF signal generator according to an embodiment of the invention.

FIG. 6 is a gain vs frequency graph that illustrates the effect of the filtering out of harmonics produced by the single tone RF signal generator 100 shown in FIG. 5. As noted above, the power amplifier 122 can itself provide a degree of attenuation at higher frequencies (the response of the amplifier in this respect is shown by the line 80). FIG. 6 also illustrates the presence of the first harmonic (H1) corresponding to the single tone to be produced by the generator 100, the Second harmonic (H2) and the third harmonic (H3). FIG. 6 further illustrates the addition to the RF signal of predistortion harmonics. In particular, there is shown a predistortion harmonic "Pre H2" corresponding to the second harmonic at the output and a predistortion harmonic "Pre H3" corresponding to the third harmonic H3 at the output. Note that the frequencies of the predistortion harmonics may generally be chosen to correspond to the frequencies of the harmonics at the output. Accordingly, assuming that the single tone to be produced by the generator 100 in this example has a frequency F, the frequencies of the predistortion harmonics are n×F, where n is an integer greater than 1. It is also envisaged that in some embodiments the frequencies of the predistortion harmonics may not match the frequencies of the harmonics at the output. This may be useful for reducing the level of spurs at the output.

The effect of adding the predistortion harmonics to the R signal before it is amplified is to cancel out the harmonies that would otherwise be produced and introduced to the output signal during amplification by the power amplifier 122 shown in FIG. 5.

Figure 7:
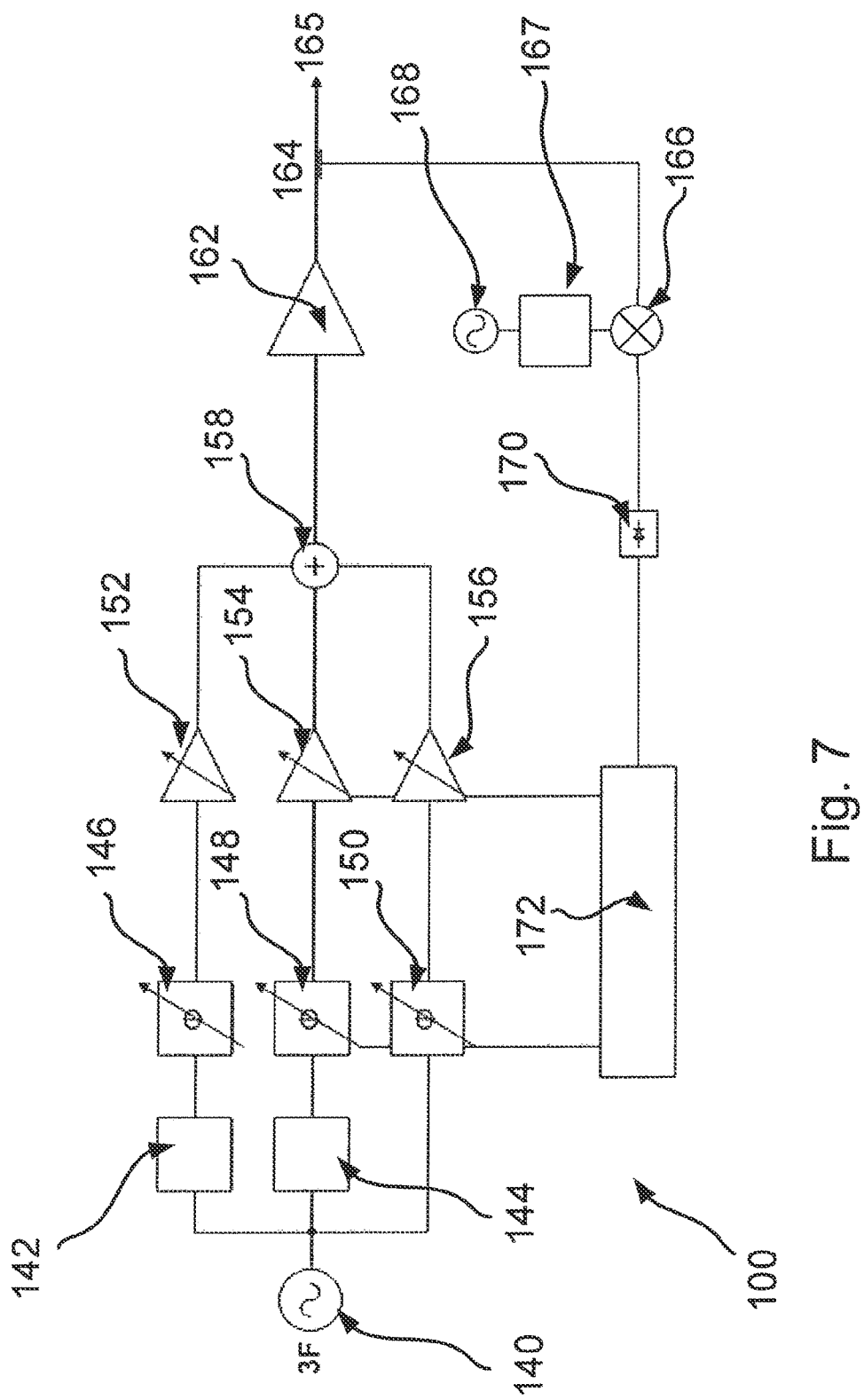
FIG. 7 shows a single tone RF signal generator in accordance with another embodiment of the invention.

FIG. 7 shows an alternative embodiment of the invention in which the arrangement for producing the predistortion harmonics is different to that described above in relation to FIG. 5. The generator 100 in FIG. 7 again includes control electronics 172 in a feedback circuit that is connected by a coupler 164 to an output 165 of the generator 100. Again, a power amplifier 162 is provided to amplify an RF signal that includes a first harmonic and one or more predistortion harmonics that are added together by an adder 158. However, in this example, only a single oscillator 140 is provided for generation of the first harmonic and the predistortion harmonics. The oscillator 140 generates a frequency that is equal to the frequency of the highest predistortion harmonic that is to be added to the RF signal. In this example, the predistortion harmonics correspond to the second and third harmonics of the fundamental of the output signal. Accordingly, the oscillator 140 generates a frequency that is 3F (where F is the frequency of the single tone to be generated by the generator 100).

As shown in FIG. 7, one or more dividers 142, 144 can be provided to divide the frequency produced by the oscillator 140 in order to reduce it down to the frequencies of the envisaged single tone to be produced by the generator 100 and any intervening predistortion harmonics. In the example of FIG. 7, the divider 142 is thus a divider by 3 for producing a frequency corresponding to the single tone, whereas the divider 144 is a divider by 3/2 for producing the frequency 2F of the second harmonic. Note that a divider need not be used for the frequency of the highest predistortion harmonic, which may be taken directly from the oscillator 140.

The arrangement of phase shifters 146, 148, 150 and variable gain amplifiers 152, 154, 156 in FIG. 7 is similar in operation to that described above in relation to FIG. 5. These components can be operated by the control electronics 172 in accordance with the detected levels of harmonies of the single tone in the signal at the output 165.

In this example, the feedback circuit includes a down conversion stage including an oscillator 168, a plurality of dividers 167 and a plurality of mixers 166 which can be used to lower the frequency of the feedback signal received via the coupler 164 for appropriate detection by the detector 170 as noted above. The arrangement of the down conversion stage in this example differs from the example in FIG. 5 in that, instead of including multiple separate oscillators, a single oscillator is used to generate an initial frequency that is then modified as required using the dividers 167. It is envisaged that the down conversion stage of FIG. 5 could be used in the embodiment of FIG. 7, and vice versa. Again the amplitudes of the single tone and any accompanying harmonics as determined by the detector 170 can be provided to the control electronics 172 to allow appropriate adjustment of the phases and/or amplitudes of the predistortion harmonics in order to optimise (minimise) the levels of the harmonics at the output.

In the following, a specific example of the manner in which the parameters (e.g. phase, amplitude) of the predistortion harmonics can be determined will be set out in more detail. For the purposes of this example, it will be assumed that the RF signal is sinusoidal. It will also be assumed that only the second and third harmonics are of interest. For example, it may be that higher harmonics are attenuated by the power amplifier to the extent that they are not of concern. The skilled person will nevertheless realise that the example provided here may be extended and modified in order to include such higher harmonics if so desired.

The non-linear transfer function of a power amplifier may be expressed as:

$$y(t)=\alpha_0+\alpha_1 x(t)+\alpha_2 x^2(t)+\alpha_3 x^3(t)$$

With reference to FIGS. 5 and 7, and assuming for the moment that no predistortion harmonics are added, the RF signal at the input of the power amplifier may be expressed as:

$$x(t)=\sin(\omega t+\phi)$$

The output of the power amplifier is therefore given by:

$$y(t)=\alpha_0+\alpha_1 \sin(\omega t+\phi)+\alpha_2 \sin^2(\omega t+\phi)+\alpha_3 \sin^3(\omega t+\phi)$$

Or:

$$y(t)=\alpha_0+\alpha_1 \sin(\omega t+\phi)+\alpha_2[\tfrac{1}{2}-\tfrac{1}{2}\cos(2\omega t+2\phi)]+\alpha_3[\tfrac{3}{4}\sin(\omega t+\phi)-\tfrac{1}{4}\sin(3\omega t+3\phi)]$$

The output thus includes unwanted second and third harmonics, in addition to the single tone at frequency $F=\omega/2\pi$.

As described herein; predistortion harmonics are added to the RF signal that is provided to the power amplifier. The RF signal at the input of the power amplifier, including the predistortion harmonics, may be expressed as:

$$x'(t)=a\sin(\omega t+\phi)+b\sin(2\omega t+\phi_2)+c\sin(3\omega t+\phi_3)$$

Here, a, $\phi$ and $\omega$ are the amplitude, phase and angular frequency of the first harmonic (having a frequency $F=\omega/2\pi$ corresponding to the frequency of the single tone to be produced at the output of the generator 100), while b, c, $\phi_2$ and $\phi_3$ are the amplitudes and phases of the predistortion harmonies.

Given this input, the output of the power amplifier becomes:

$$y(t) =$$

$$\alpha_0 + \frac{\alpha_2}{2}(a^2 + b^2 + c^2) + 3\frac{\alpha_3}{2}\left(abc\sin(\varphi + \varphi_2 - \varphi_3) + \frac{a^2b}{2}\sin(2\varphi - \varphi_2)\right) +$$

$$\alpha_1 a\sin(\omega t + \varphi) + \alpha_2[abc\cos(\omega t - \varphi + \varphi_2) + bc\cos(\omega t - \varphi_2 + \varphi_3)] +$$

$$\frac{3}{4}\alpha_3[(a^3 + 2a(b^2 + c^2))\sin(\omega t + \varphi) - a^2c\sin(\omega t - 2\varphi + \varphi_3) +$$

$$b^2c\sin(\omega t + 2\varphi_2 - \varphi_3)] + \alpha_1 b\sin(2\omega t + \varphi_2) +$$

$$\frac{1}{2}\alpha_2[-a^2\cos(2\omega t + 2\varphi) + 2ac\cos(2\omega t - \varphi + \varphi_3)] +$$

$$\frac{3}{4}\alpha_3[2abc\sin(2\omega t + \varphi - \varphi_2 + \varphi_3) + (b^3 + 2a^2b + 2bc^2)\sin(2\omega t + \varphi_2)] +$$

$$\alpha_1 c\sin(3\omega t + \varphi_3) - \alpha_2 abc\cos(3\omega t + \varphi + \varphi_2) + \frac{3}{4}\alpha_3\left[-\frac{a^3}{3}\sin(3\omega t + 3\varphi) +\right.$$

$$\left.(c^3 + 2a^2c + 2b^2c)\sin(3\omega t + \varphi_3) + ab^2\sin(3\omega t + 2\varphi_2 - \varphi)\right] +$$

$$\frac{1}{2}\alpha_2[-b^2\cos(4\omega t + 2\varphi_2) - 2ac\cos(4\omega t + \varphi + \varphi_3)] +$$

$$\frac{3}{4}\alpha_3[2abc\sin(4\omega t - \varphi + \varphi_2 + \varphi_3) - a^2b\sin(4\omega t + 2\varphi + \varphi_2) +$$

$$bc^2\sin(4\omega t + 2\varphi_3 - \varphi_2)] - \alpha_2 bc\cos(5\omega t + \varphi_2 + \varphi_3) +$$

$$\frac{3}{4}\alpha_3[-a^2c\sin(5\omega t + 2\varphi + \varphi_3) - ab^2\sin(5\omega t + 2\varphi_2 + \varphi) +$$

$$ac^2\sin(5\omega t + 2\varphi_3 - \varphi)] - \frac{1}{2}\alpha_2 c^2\cos(6\omega t + 2\varphi_3) +$$

$$\frac{3}{4}\alpha_3\left[-2abc\sin(6\omega t + \varphi + \varphi_2 + \varphi_3) - \frac{b^3}{3}\sin(6\omega t + 3\varphi_2)\right] -$$

$$\frac{3}{4}\alpha_3[ac^2\sin(7\omega t + 2\varphi_3 + \varphi) + b^2c\sin(7\omega t + 2\varphi_2 + \varphi_3)] -$$

$$\frac{3}{4}\alpha_3[bc^2\sin(8\omega t + 2\varphi_3 + \varphi_2)] - \frac{1}{4}\alpha_3 c^3\sin(9\omega t + 3\varphi_3)$$

Here, harmonics up to the ninth harmonic have been included.

As described herein, the second and third harmonies of the output signal of the power amplifier may be cancelled out by appropriate selection of the amplitudes and phases for the predistortion harmonics (again however, it is envisaged that higher order predistiortion harmonics may also be included). These amplitudes and phases can be approximated if we consider that they are small compared to the amplitude and phase of the first harmonic corresponding to the single tone of the output signal, and if we consider a small amount of distortion:

$b \ll a$ $c \ll a$.

In this case, the second and third harmonics of the output signal of the power amplifer become:

$$H2 = \alpha_1 b\sin(2\omega t + \varphi_2) - \frac{1}{2}\alpha_2 a^2 \cos(2\omega t + 2\varphi) + \frac{3}{2}\alpha_3 a^2 b\sin(2\omega t + \varphi_2)$$

$$H3 = \alpha_1 c\sin(3\omega t + \varphi_3) + \frac{3}{4}\alpha_3 \left[-\frac{a^3}{3}\sin(3\omega t + 3\varphi) + 2a^2 c\sin(3\omega t + \varphi_3)\right]$$

As noted above, parameters of the predistortion harmonics can be chosen or adjusted by the control electronics to optimise (minimise) harmonics at the output of the generator 100. In one example, these parameters can be chosen as:

$$b \approx -\frac{a^2 \alpha_2}{2\alpha_1 + 3a^2 \alpha_3}$$

$$\varphi_2 \approx 2\varphi - \frac{\pi}{2}$$

$$c \approx \frac{1}{2} \frac{a^3 \alpha_3}{2\alpha_1 + 3a^2 \alpha_3}$$

$$\varphi_3 \approx 3\varphi$$

These parameters can cancel out harmonics produced by the power amplifier during amplification of the RF signal.

Note that the parameters of the predistortion harmonics noted above are thus linear functions of the amplitude and phase of the first harmonic corresponding to the single tope of the output signal. A consequence of this is that if the amplitude or phase of the first harmonic changes, then the parameters of the predistortion harmonics may also need to be changed to ensure that the harmonics at the output are minimised.

In accordance with an embodiment of the invention, the control electronics 130, 172 may calibrate or adjust the parameters at start-up of the generator and/or when any change in the parameters of the first harmonic is noticed and/or in response to amplitude signals received from the feedback circuit. Note that in some cases, the addition of lower predistortion harmonics (e.g. pre H2) can give rise to a higher order intermodulation product at the frequency of a higher predistortion harmonic (e.g. Pre H3). For this reason, it is envisaged that the calibration routine can involve determining the phase(s) and amplitude(s) of one or more lower predistortion harmonics prior to determination of one or more higher predistortion harmonies. In this way, contributions from intermodulation at the frequencies of the higher harmonics can be factored into the determination of the parameters of the higher predistortion harmonics, for optimal suppression of those harmonics.

Note that the parameters b, $\phi_2$, c, $\phi_3$ are generally independent of the frequency of the frequency of the first harmonic. In practice it is envisaged that this may not be the case and that the control electronics 130, 172 may be configured to tune the parameters of the predistortion harmonics (based on the amplitudes detected by the detectors 128, 172) to account for any residual frequency dependence.

Accordingly, there has been described a single tone RF signal generator and a method of generating a single tone RF signal. The single tone RF signal generator includes an output and a power amplifier that has an input. The power amplifier is operable to receive an RF signal including a first harmonic corresponding to a single tone signal to be produced by the signal generator. The power amplifier is also operable to amplify the RF signal. The power amplifier is further operable to provide the amplified RF signal to the output of the signal generator. The single tone RF signal generator further includes a feedback circuit connected between the output of the signal generator and the input of the power amplifier. The feedback circuit is configured to add one or more predistortion harmonics to the RF signal received by the power amplifier for cancelling harmonics in the amplified RF signal provided by the power amplifier.

Although particular embodiments of the invention have been described, it will be appreciated that many modifications/additions and/or substitutions may be made within the scope of the claimed invention.

The invention claimed is:

1. A single tone RF signal generator comprising:
   an output;
   a power amplifier having an input, wherein the power amplifier is configured to receive at said input an RF signal including a first harmonic corresponding to a single tone RF signal to be produced by the single tone RF signal generator, amplify the RF signal, and provide the amplified RF signal to the output of the single tone RF signal generator; and
   a feedback circuit connected between the output of the single tone RF signal generator and the input of the power amplifier, wherein the feedback circuit is configured to add predistortion harmonics to the RF signal received by the power amplifier to cancel harmonics in the amplified RF signal provided by the power amplifier, wherein the predistortion harmonics have frequencies that are overtones of a fundamental frequency of the single tone RF signal.

2. The single tone RF signal generator of claim 1, wherein the first harmonic has a frequency F, and wherein the predistortion harmonics have frequencies n×F, where n is an integer greater than 1.

3. The single tone RF signal generator of claim 2, further comprising:
   a respective oscillator configured to generate the first harmonic and each predistortion harmonic of the RF signal received by the power amplifier.

4. The single tone RF signal generator of claim 2, further comprising:
   a common oscillator and one or more frequency dividers configured to divide a frequency produced by the common oscillator to generate the first harmonic and each predistortion harmonic of the RF signal received by the power amplifier.

5. The single tone RF signal generator of claim 4, wherein the common oscillator is configured to generate a frequency N×F, where N is a value of n for a highest predistortion harmonic added to the RF signal.

6. The single tone RF signal generator of claim 1, wherein the feedback circuit includes:
   a down-conversion stage configured to down-convert a frequency of the feedback signal from the output of the single tone RF signal generator; and
   one or more detectors configured to detect a power of the single tone RF signal produced by the single tone RF signal generator and one or more harmonics of the single tone RF signal.

7. The single tone RF signal generator of claim 6, wherein the down-conversion stage comprises:
   one or more pairs of mixers and oscillators configured to down-convert the single tone RF signal and said one or more harmonics into respective DC or lower frequency signals indicative of their respective power.

8. The single tone RF signal generator of claim 1, wherein the feedback circuit is configured to determine phases and amplitudes of the predistortion harmonics as a linear function of a phase and/or amplitude of the single tone RF signal.

9. The single tone RF signal generator of claim 8, configured dynamically to adjust the phases and amplitudes of the predistortion harmonics in response to a change in the phase and/or amplitude of the single tone RF signal.

10. The single tone RF signal generator of claim 8, configured to perform a calibration routine in which phase(s) and amplitude(s) of one or more lower predistortion harmonics are determined prior to determination of one or more higher predistortion harmonics.

11. The single tone RF signal generator of claim 1, wherein the RF signal received by the power amplifier is given by:

$$x'(t) = a \sin(\omega t + \phi) + b \sin(2\omega t + \phi_2) + c \sin(3\omega t + \phi_3)$$

where:
- $a$, $\phi$ and $\omega$ an amplitude, a phase, and an angular frequency of the first harmonic;
- $b$, $c$, $\phi_2$ and $\phi_3$ are respective amplitudes and phases of the predistortion harmonics,
- wherein $b \ll a$ and $c \ll a$ such that second and third harmonics of the output signal of the power amplifier may be approximated to:

$$H2 = \alpha_1 b \sin(2\omega t + \varphi_2) - \frac{1}{2}\alpha_2 a^2 \cos(2\omega t + 2\varphi) + \frac{3}{2}\alpha_3 a^2 b \sin(2\omega t + \varphi_2)$$

$$H3 = \alpha_1 c \sin(3\omega t + \varphi_3) + \frac{3}{4}\alpha_3 \left[ -\frac{a^3}{3}\sin(3\omega t + 3\varphi) + 2a^2 c \sin(3\omega t + \varphi_3) \right]$$

and wherein $$b \approx -\frac{a^2 \alpha_2}{2\alpha_1 + 3a^2 \alpha_3}$$

$$\varphi_2 \approx 2\varphi - \frac{\pi}{2}$$

$$c \approx \frac{1}{2}\frac{a^3 \alpha_3}{2\alpha_1 + 3a^2 \alpha_3}$$

$$\varphi_3 \approx 3\varphi$$

for canceling out the second and third harmonics.

12. The single tone RF signal generator of claim 1, wherein the feedback circuit is further configured to add the predistortion harmonics to cancel a spur in the amplified RF signal provided by the power amplifier.

13. An RF heating apparatus comprising the single tone RF signal generator according to claim 1.

14. A method of generating a single tone RF signal, the method comprising:
- amplifying an RF signal including a first harmonic corresponding to the single tone RF signal;
- providing the amplified RF signal to an output of a single tone RF signal generator; and
- canceling harmonics in the amplified RF signal provided to the output by using feedback from the output to add predistortion harmonics to the RF signal prior to said amplifying, wherein the predistortion harmonics have frequencies that are overtones of a fundamental frequency of the single tone RF signal.

15. The method of claim 14, wherein the first harmonic has a frequency F, and the predistortion harmonics have frequencies n×F, where n is an integer greater than 1.

* * * * *